(12) United States Patent
Cordes et al.

(10) Patent No.: US 7,248,195 B2
(45) Date of Patent: Jul. 24, 2007

(54) METHODS AND APPARATUS FOR MULTIPLEXED DIGITAL INPUTS USING AN ANALOG-TO-DIGITAL CONVERTER

(75) Inventors: Kevin Cordes, Miller Place, NY (US); Joe Cabana, Centereach, NY (US)

(73) Assignee: Symbol Technologies, Inc., Holtsville, NY (US)

( * ) Notice: Subject to any disclaimer, the term of this patent is extended or adjusted under 35 U.S.C. 154(b) by 52 days.

(21) Appl. No.: 11/291,657

(22) Filed: Nov. 30, 2005

(65) Prior Publication Data

US 2007/0120719 A1 May 31, 2007

(51) Int. Cl.
*H03M 1/12* (2006.01)
(52) U.S. Cl. .................. 341/155; 341/29; 341/154; 341/131
(58) Field of Classification Search ............. 341/29, 341/154, 155, 131; 702/107
See application file for complete search history.

(56) References Cited

U.S. PATENT DOCUMENTS

| 4,733,216 | A | * | 3/1988 | Wright | 341/131 |
| 5,568,143 | A | * | 10/1996 | Hutchison et al. | 341/139 |
| 5,969,659 | A | * | 10/1999 | Balch et al. | 341/159 |
| 6,178,388 | B1 | * | 1/2001 | Claxton | 702/107 |
| 6,476,753 | B1 | * | 11/2002 | Hansen et al. | 341/155 |
| 7,064,682 | B2 | * | 6/2006 | Fedigan | 341/29 |

\* cited by examiner

*Primary Examiner*—Jean Bruner Jeanglaude
(74) *Attorney, Agent, or Firm*—Ingrassia Fisher & Lorenz, P.C.

(57) ABSTRACT

A multiplexing circuit uses parallel-configured switch/resistor pairs in a voltage divider network in such a way that a single analog-to-digital input can be used to specify the state of more than one switch or other component. One circuit includes a reference voltage node, a ground node, and an output node, wherein a switched voltage divider network is configured such that the voltage at the output node is unique for every given combination of switch states.

17 Claims, 3 Drawing Sheets

METHODS AND APPARATUS FOR MULTIPLEXED DIGITAL INPUTS USING AN ANALOG-TO-DIGITAL CONVERTER

TECHNICAL FIELD

The present invention generally relates to analog-to-digital converter circuitry and, more particularly, to systems for utilizing a single analog-to-digital converter input to represent a plurality of switches or digital inputs.

BACKGROUND

It is often necessary to monitor the state of various switches, buttons, triggers, and other components in a device. Traditionally, each such switch is connected to an independent input to a processor so that the processor can react when any one or several of the inputs are activated. In a mobile barcode scanning terminal, for example, the power button, the scan trigger, the battery door, and many other components are often monitored continuously. As the number of inputs increases, the number of required general purpose input/output (GPIO) pins on the processor also increases.

In many cases, the only way to increase the number of GPIO pins is to include a larger, more expensive microprocessor, causing the product to increase in size and cost. This is most notably a problem in mobile devices, where miniaturization is key, and there is therefore always a need to reduce the amount of board-space taken up by components.

R2R ladder networks, which are well-known in the art for their use in successive-approximation registers, allow the position of a series of switches to be converted to an analog output voltage. These circuits are central to traditional digital-to-analog techniques. Such R2R ladder networks are undesirable, however, in that they require a great many resistors and use single-pole/double-throw switches, which tend to be expensive, large, and complex.

Accordingly, there is a need for systems and methods that allow the state of multiple switches and other binary digital inputs to be monitored without increasing the number and/or size of processors used in the system.

BRIEF SUMMARY

A multiplexing circuit in accordance with the present invention uses parallel-configured switch/resistor pairs in a voltage divider network in such a way that a single analog-to-digital input can be used to specify the state of more than one switch or other component.

The above and other aspects of the invention may be carried out in one form by a circuit comprising: a reference voltage node, a ground node, and an output node; a first resistor in series with a first switch, wherein the first resistor and the first switch are connected between the output node and the ground node; a second resistor in series with a second switch, wherein the second resistor and the second switch are connected between the output node and the ground node; and a third resistor connected between the reference voltage node and the output node, wherein the output voltage at the output node is unique for each combination of switch states for the first and second switches.

BRIEF DESCRIPTION OF THE DRAWINGS

A more complete understanding of the present invention may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the invention or the application and uses of the invention. Furthermore, there is no intention to be bound by any expressed or implied theory presented in the preceding technical field, background, brief summary or the following detailed description.

In addition, the invention may be described herein in terms of functional and/or logical block components and various processing steps. It should be appreciated that such block components may be realized by any number of hardware, software, and/or firmware components configured to perform the specified functions.

Figure 1:
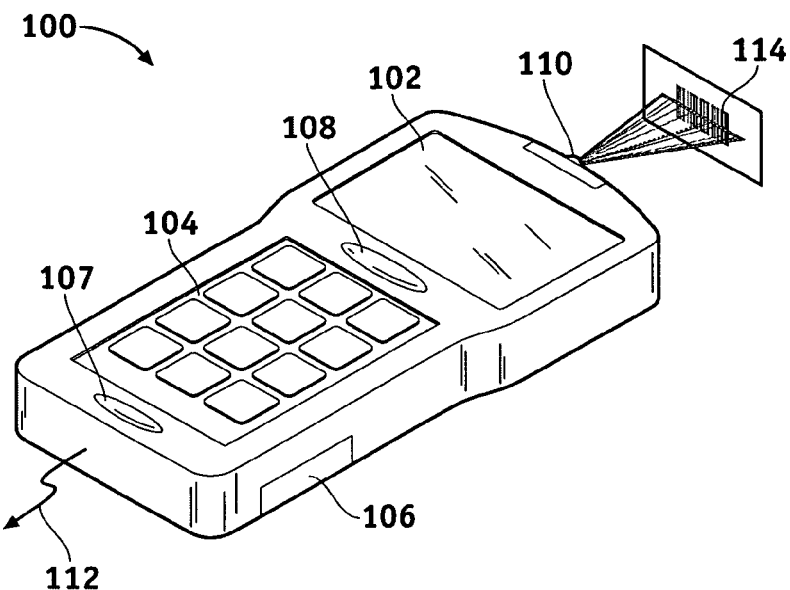
FIG. 1 is an overview of a terminal device useful in illustrating operation of the present invention.

Although the present invention may be used in conjunction with any type of device, FIG. 1 depicts a particular example useful in illustrating operation of a multiplexer in accordance with the present invention. In general, a mobile scanning terminal 100 includes an input device (e.g., keyboard or keypad) 104, a power switch 107, a battery door 106, a scan trigger 108, a scanner 110, and a display 102. Scanner 110 comprises any suitable scanning or imaging device capable of reading printed indicia (e.g., a barcode) 114 and creating an electronic representation of that image, which is then processed by terminal 100. Such scanners might include, for example, charge coupled device (CCD) image sensors, laser scanners, lenses, and other optical components. Terminal 100 typically includes various microprocessors, memory, digital-signal-processors (DSPs) and input/output components (not shown in FIG. 1). Terminal 100 might also include a communication link 112 (e.g., a wireless network connection) to allow it to communicate with a host, server, or stand-alone computer.

Figure 2:
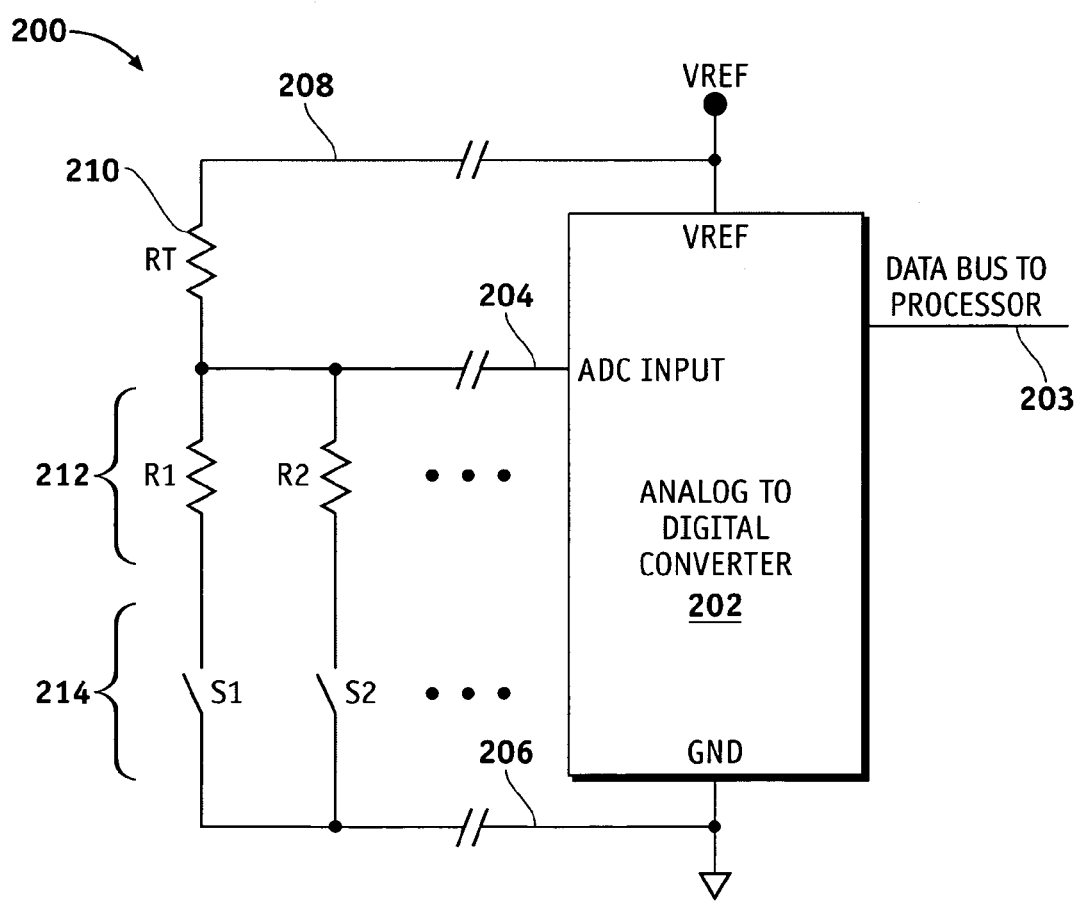
FIG. 2 is a circuit diagram in accordance with one embodiment of the present invention.

As described above, prior art systems typically include separate digital inputs to a processor located within terminal 100 in order to monitor the state of battery door 106, scan trigger 108, power switch 107, and any other such components. Referring to FIG. 2, however, a multiplexer circuit 200 in accordance with one embodiment of the present invention allows a single analog-to-digital input to be used to specify the state of multiple inputs.

Referring to FIG. 2, the multiplexer circuit generally includes an analog-to-digital converter (ADC) 202, a plurality of resistors 212 (R1, R2, . . . , Rn) coupled to respective switches 214 (S1, S2, . . . Sn), and a resistor 210—all of which are configured as a voltage-divider network with respect to VREF 208 and GND 206. ADC 202 has an ADC input 204, a data output 203, a ground (GND) terminal 206, and a reference voltage terminal (VREF) 208.

Each set of resistors 212 and switches 214, which themselves are connected in series, are connected in parallel between ADC input 204 and GND 206. Resistor RT is connected between VREF 208 and ADC input 204. A variety of resistor types may be used for resistors 212 and 210; for example, standard axial resistors (e.g., carbon or metal-film resistors) single-in-line (SIL) resistor networks, surface-mount resistors, thin-film resistors, or the like.

Each switch 214 is coupled to and/or represents some binary state of the application in which it is placed. For example, with respect to the terminal example shown in FIG. 1, a switch S1 might correspond to the state of battery door 106 (open/closed), while switch S2 might correspond to the state of power button 108 (pressed/released). Indeed, switches 214 may correspond to any respective set of digital inputs.

When a particular switch is "on," the corresponding resistor becomes part of the voltage divider circuit; but when it is "off," the corresponding resistor is inactive. Thus, by selecting values of RT, R1, R2 . . . . Rn, the analog ADC input 204 is unique for any given combination of "on" and "off" switches.

More particularly, consistent with voltage-division circuitry, the voltage at ADC input 204 is equal to a fraction of VREF, where that fraction is determined by the ratio of resistor 210 to the contribution of resistors 212 as activated by switches 214. This contribution is equal to the equivalent resistance Req of the parallel sum of all activated resistors 212. Thus, if S1 and S2 are both "on" (closed), then both R1 and R2 are activated, and the effective resistance of activated resistors 212 is given by 1/Req=(1/R1++1/R2). The voltage at ADC input 204 is then VREF(Req/(RT+Req)).

Given a particular ADC input voltage, then, ADC 202 produces a corresponding digital representation of that voltage (e.g., an eight-bit word) using conventional analog-to-digital techniques. In the illustrated embodiment, the digital output 203 is provided on a data bus to a microprocessor; however, digital output 203 may be of any convenient form (e.g., parallel bits, serial data, etc.) The digital output 203 can then be decoded by subsequent processing (e.g., by a microprocessor) based on an a priori knowledge of this relation—e.g., a look-up table or equation specifying the relationship between ADC input 204 and state of switches 214.

More particularly, when the values of the various resistors 212 and 210 are specified, a suitable memory component is used to store a relation that uniquely maps the state of the plurality of switches to respective voltage values. During operation, the ADC 202 reads the analog voltage value 204 produced by the voltage divider network coupled to the plurality of switches, then converts the analog voltage value to a digital voltage representation. The microprocessor then uses digital voltage representation and the stored relation to determine the state of the plurality of switches.

Figure 3:
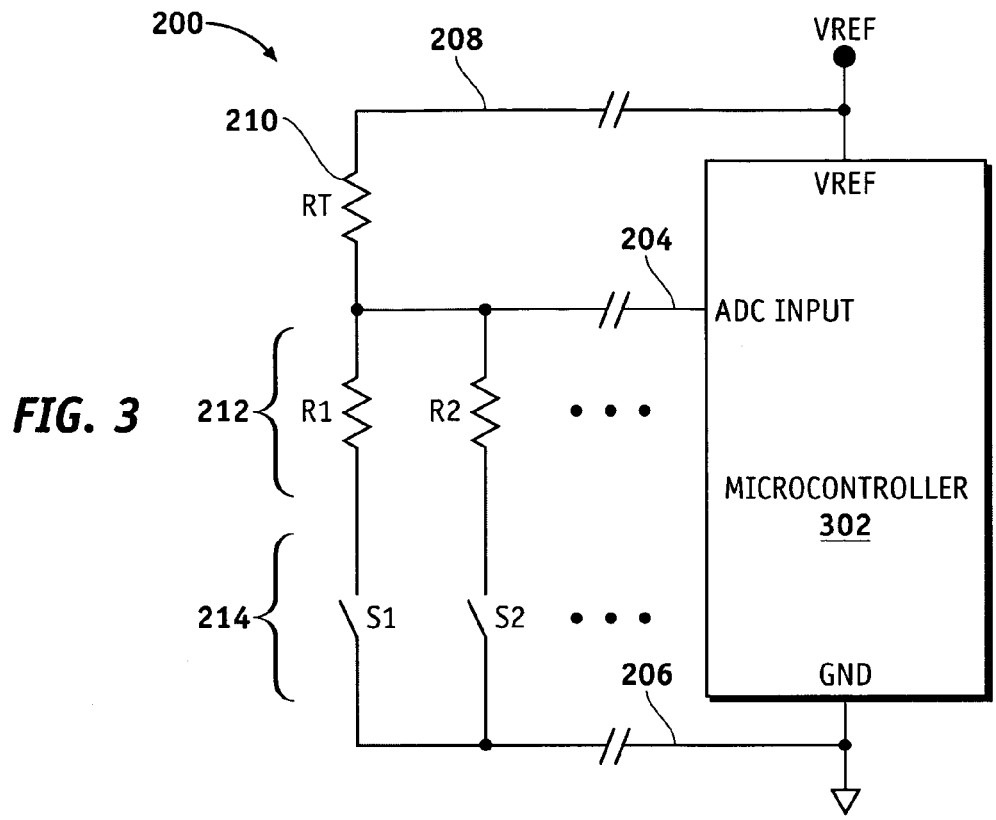
FIG. 3 is a circuit diagram in accordance with another embodiment of the present invention.

In an alternate embodiment, shown in FIG. 3, ADC 202 is replaced by a microcontroller 302 that has an ADC input 204, and which has an internal ADC (not shown in FIG. 3). That is, many microcontrollers include an internal ADC. The present invention contemplates that the multiplexer circuitry described herein may be used in conjunction with any device, circuit, or component that accepts an analog input to an ADC.

Figure 4:
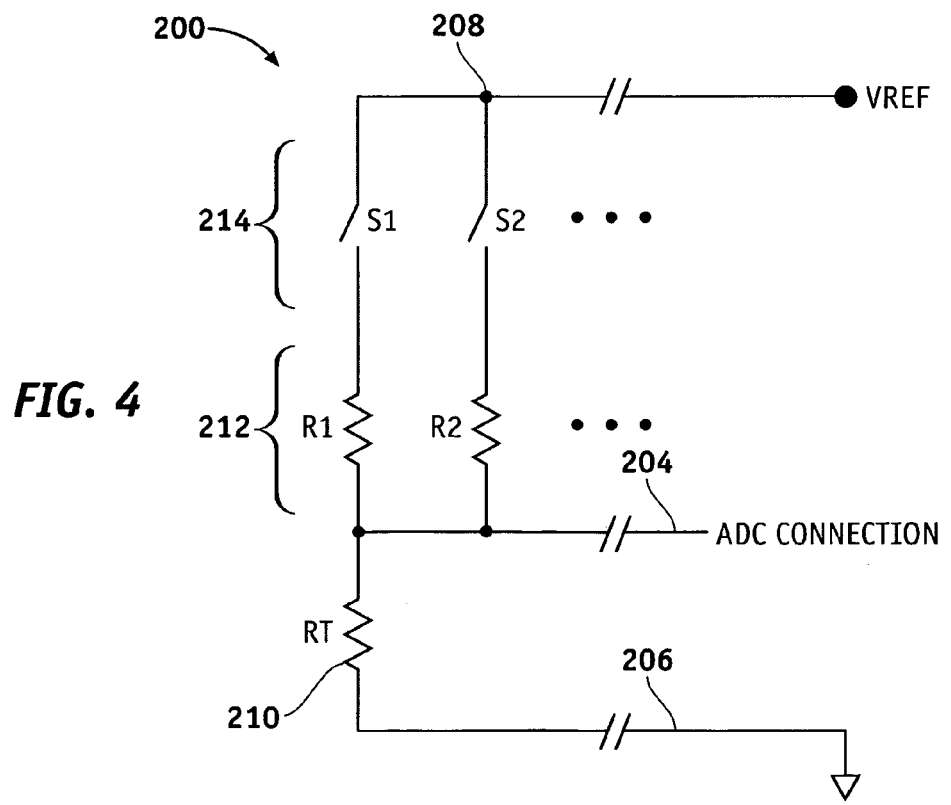
FIG. 4 is a circuit diagram in accordance with another embodiment of the present invention.

FIG. 4 depicts an alternate embodiment in which the resistors 212 and switches 214 are connected between VREF 208 and ADC connection 204, and resistor 210 is connected between ADC connection 204 and GND 206. The relationship between ADC input 204 and the various resistors can be easily derived as demonstrated above with respect to the circuit illustrated in FIG. 2.

Figure 5:
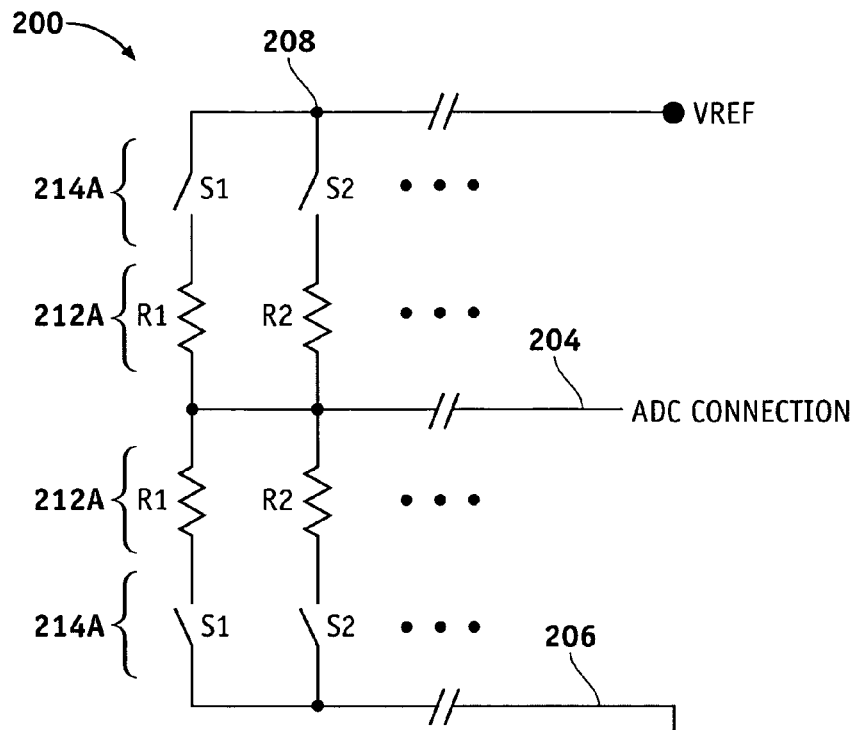
FIG. 5 is a circuit diagram in accordance with yet another embodiment of the present invention.

FIG. 5 depicts yet another embodiment, wherein a first set of resistors 212(a) and switches 214(a) are connected between VREF 208 and ADC connection 204, and a second set of resistors 212(b) and switches 214(b) are connected between ADC connection 204 and GND 206. As with the previous embodiments, the values of resistors 212(a) and 212(b) may be selected in accordance with the number of binary inputs being considered and other design features (e.g., the tolerance values of the resistors being used). Again, the relationship between ADC input 204 and the various resistors can be easily derived as demonstrated above with respect to the circuit illustrated in FIG. 2.

The tolerance of the resistors (i.e., the maximum error in resistance value) controls, to a large extent, the resolution of possible analog values that can be generated for ADC input 204. That is, the better (i.e., lower) the tolerance value, the more resistors and switches that can be incorporated into the voltage divider network while ensuring that a unique voltage is presented at ADC input 204 for each combination of switch states. Accordingly, in one embodiment of the present invention, resistors 212 are of the type having a 1% tolerance, and four resistors and switches are used (n=4). In another embodiment, resistors 212 have a 0.5% tolerance, and five resistors and switches are used (n=5).

As mentioned above, the values of resistors R1–Rn are selected such that the value of ADC input 204 is unique for every combination of activated and non-activated resistors. In the case where n=2, for example, the resistors (R1 and R2) should be selected such that ADC input 204 has four unique analog values. In general, resistors R1, R2, . . . , Rn should be selected such that ADC input 204 has $2^n$ unique analog values. Because each value is unique, subsequent processing can determine the state of switches S1, S2, . . . , Sn as long as the relationship between the switches and analog input 204 is known. In one embodiment, this relation is stored in a volatile or non-volatile memory device associated with the device.

Figure 6:
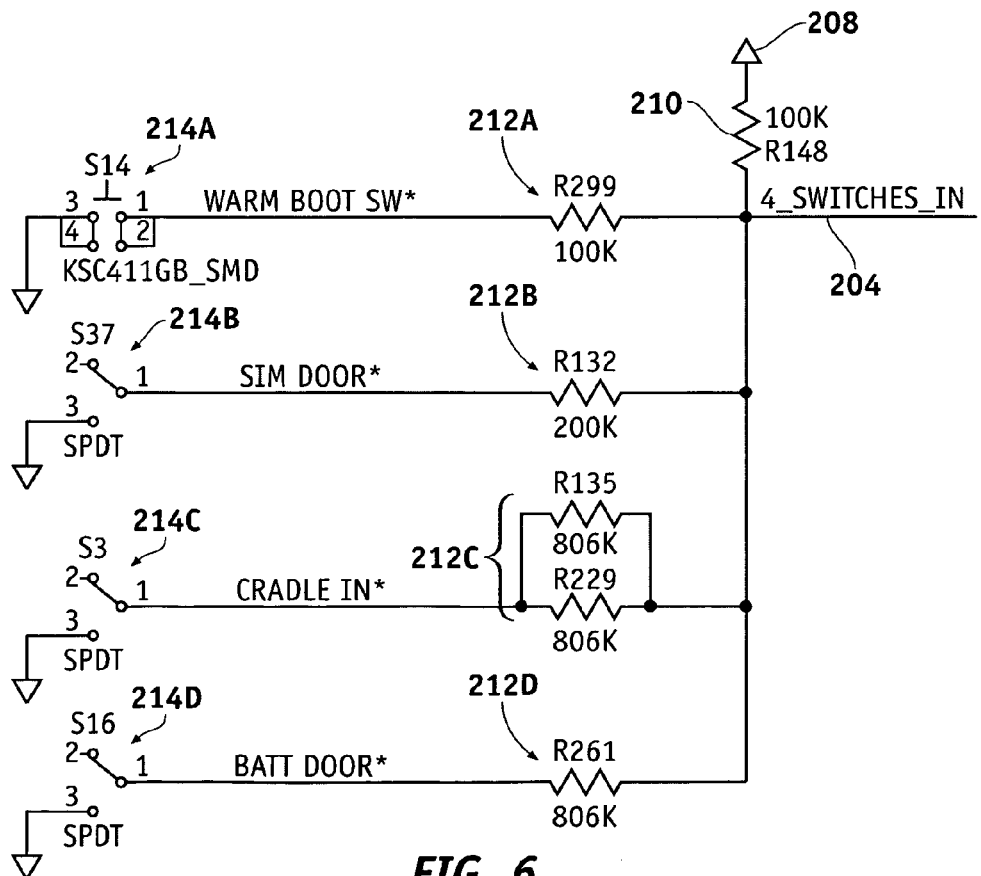
FIG. 6 is a circuit in accordance with one embodiment of the present invention.

In accordance with a specific mobile terminal embodiment, shown in FIG. 6, the circuit is configured with four resistors 212(a)–(d) and corresponding switches 214(a)–(d) having respective values of 100K, 200K, 403K (two parallel 806K resistors in parallel, in this embodiment), and 806K. Resistor 210 has a value of 100K. Line 204 is used as the input to an ADC (not shown). In this application, switch 214(d) corresponds to the battery door, and indicates whether the battery is about to be removed. Switch 214(c) indicates whether the terminal is in or out of a cradle. Switch 214(b) indicates whether a card (e.g., a subscriber identification module (SIM) card) is being removed or inserted into the terminal, and switch 214(a) initiates a "warm boot" of the system.

In summary, the present invention generally provides a way of using parallel-configured switch/resistor pairs in a voltage divider network such that a single ADC input can be used to specify the state of more than one switch or digital input. It will be appreciated that this solution used approximately half the number of resistors that would be required in a comparable R2R ladder network, and requires only inexpensive momentary switches. Furthermore, the switches of the current invention do not need to be connected to both a high and low voltage reference, as with R2R networks.

While at least one example embodiment has been presented in the foregoing detailed description, it should be appreciated that a vast number of variations exist. It should also be appreciated that the example embodiment or embodiments described herein are not intended to limit the scope, applicability, or configuration of the invention in any way. Rather, the foregoing detailed description will provide those skilled in the art with a convenient road map for implementing the described embodiment or embodiments. It should be understood that various changes can be made in the function and arrangement of elements without departing from the scope of the invention as set forth in the appended claims and the legal equivalents thereof.

What is claimed is:

1. A multiplexer circuit comprising:
a reference voltage node;
a ground node;
an output node;
a first resistor in series with a first switch, said first resistor and said first switch connected between said output node and said ground node, said first switch having a switch state;
a second resistor in series with a second switch, said second resistor and said second switch connected between said output node and said ground node, said second switch having a switch state;
a third resistor connected between said reference voltage node and said output node, wherein said first resistor, said second resistor, and said third resistor have values selected such that an output voltage at said output node is unique for each combination of said switch states for said first and second switches.

2. The circuit of claim 1, further including an analog-to-digital converter having an input coupled to said output node and an output coupled to a microprocessor.

3. The circuit of claim 1, further including a microprocessor having an internal analog-to-digital converter and an input coupled thereto, wherein said input is connected to said output node.

4. The circuit of claim 1, wherein each of said switches correspond to the physical state of a component of a mobile device.

5. The circuit of claim 4, wherein the mobile device comprises a portable barcode scanner terminal.

6. A multiplexer circuit comprising:
a voltage divider network having an output coupled to the input of an analog-to-digital converter, said network comprising:
a plurality of parallel-configured switch/resistor pairs, each said switch/resistor pair comprising a resistor in series with a switch, wherein each of said switches has a switch state, and wherein said output is unique for each combination of said switch states.

7. The circuit of claim 6, further including an analog-to-digital converter having an input coupled to said output node and an output coupled to a microprocessor.

8. The circuit of claim 6, further including a microprocessor having an internal analog-to-digital converter and an input coupled thereto, wherein said input is connected to said output node.

9. The circuit of claim 6, wherein each of said switches correspond to the physical state of a component of a mobile device.

10. The circuit of claim 9, wherein the mobile device comprises a portable barcode scanner terminal.

11. The circuit of claim 6, wherein said switches are momentary two-state switches.

12. The circuit of claim 6, wherein said resistors have a tolerance equal to or less than approximately 1.0%.

13. The circuit of claim 12, wherein said resistors have a tolerance equal to or less than 0.5%.

14. A mobile device comprising:
a microprocessor having an analog-to-digital (ADC) input;
a memory communicatively coupled to said microprocessor; and
a voltage divider network having an output coupled to said ADC input, said network comprising a plurality of parallel-configured switch/resistor pairs, each said switch/resistor pair comprising a resistor in series with a switch, wherein each of said switches has a switch state, and wherein said output is unique for each combination of said switch states in accordance with a known relation that is stored in said memory.

15. The mobile device of claim 14, further including a barcode scanner component.

16. The mobile device of claim 15, further including a display.

17. A method for determining the state of a plurality of switches, said method comprising the steps of:
storing, within a memory, a relation that uniquely maps the state of the plurality of switches to respective voltage values;
reading an analog voltage value produced by a voltage divider network coupled to the plurality of switches;
converting said analog voltage to a digital voltage representation; and
using said digital voltage representation and said relation to determine the state of the plurality of switches.

* * * * *